United States Patent [19]

Shakun

[11] Patent Number: 4,640,977

[45] Date of Patent: Feb. 3, 1987

[54] THERMOELECTRIC GENERATOR USING VARIABLE GEOMETRY WITH SUPPORT PEDESTALS OF DISSIMILAR MATERIALS THAN THE BASIC THERMOELECTRIC SEMI-CONDUCTOR ELEMENTS

[75] Inventor: Wallace Shakun, Atlanta, Ga.

[73] Assignee: Omnimax Energy Corporation, Philadelphia, Pa.

[21] Appl. No.: 852,487

[22] Filed: Apr. 16, 1986

Related U.S. Application Data

[63] Continuation-in-part of Ser. No. 603,009, Apr. 23, 1984.

[51] Int. Cl.[4] ............................................. H01L 35/28
[52] U.S. Cl. .................................................... 136/211
[58] Field of Search ................................. 136/205–212

[56] References Cited

U.S. PATENT DOCUMENTS

| | | | |
|---|---|---|---|
| 3,181,304 | 5/1965 | Böke | 136/211 |
| 3,284,235 | 11/1966 | Nottage et al. | 136/212 |
| 4,251,290 | 2/1981 | Gomez | 136/212 |
| 4,257,822 | 3/1981 | Gomez | 136/211 |
| 4,276,441 | 6/1981 | Wilson | 136/211 |
| 4,443,650 | 4/1984 | Takagi et al. | 136/211 |
| 4,444,991 | 4/1984 | Beale | 136/212 |

Primary Examiner—Stephen J. Lechert, Jr.
Assistant Examiner—T. J. Wallen
Attorney, Agent, or Firm—Seidel, Gonda, Goldhammer & Abbott

[57] ABSTRACT

A thermoelectric generator in which the effective figure of merit, the effective power coefficient and/or the power factor are optimized by providing thermoelements made from semi-conductor materials supported on pedestals made from materials having good electrical and thermal conductivity properties.

6 Claims, 17 Drawing Figures

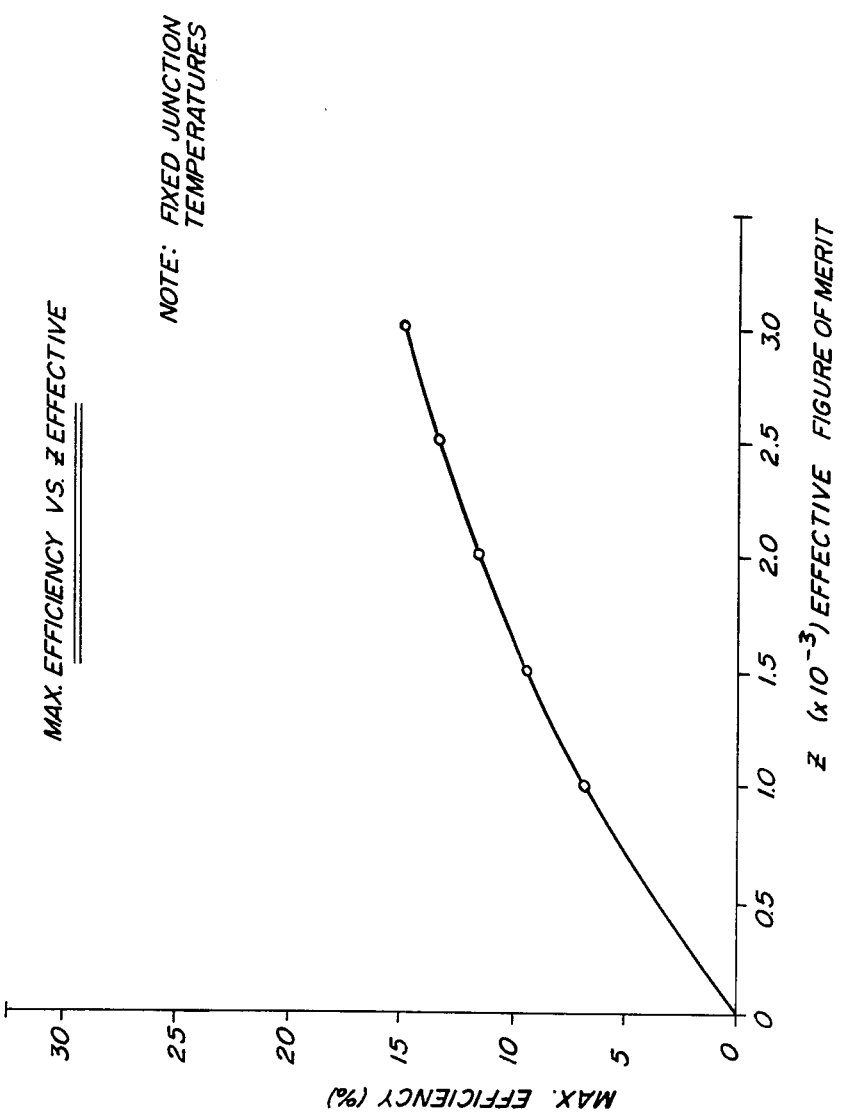

POWER FACTOR $\left(\dfrac{V^2}{R\ EFF.}\right)$ AS A FUNCTION OF THE NORMALIZED HEIGHT
(FIXED JUNCTION TEMPERATURE)

NORMALIZED EFFECTIVE FIGURE OF MERIT & ELEMENT WEIGHT
$$\left[ \frac{(\bar{Z}\ PEDESTAL) \cdot (ELEMENT\ WEIGHT\ NON\ PEDESTAL)}{(\bar{Z}\ NON\ PEDESTAL) \cdot (ELEMENT\ WEIGHT\ PEDESTAL)} \right]$$
AS A FUNCTION OF NORMALIZED HEIGHT 4,640,977

THERMOELECTRIC GENERATOR USING VARIABLE GEOMETRY WITH SUPPORT PEDESTALS OF DISSIMILAR MATERIALS THAN THE BASIC THERMOELECTRIC SEMI-CONDUCTOR ELEMENTS

CROSS-REFERENCE TO RELATED APPLICATION

This is a continuation-in-part of my copending application Ser. No. 603,009 filed Apr. 23, 1984, which is incorporated herein by reference.

BACKGROUND OF THE INVENTION

Thermoelectric generators or thermocouples are formed of two dissimilar materials joined together at one end with the other ends connected to an electrical load. The ends connected together are at a high temperature than the other ends. The temperature differential produces a flow of current across an external load and a common use of the thermocouple is in measurement of temperature.

Thermopiles may be constructed by connecting thermocouples of thermoelectric generators in series to maximize current and voltage output. In connecting thermocouples or thermoelectric generators together to form a thermopile, one group of junctions are placed in the hotter zone and the other group of junctions are placed in the colder zone. By connecting many of such thermocouples or thermoelectric generators in series, the generation of electricity at low efficiency can be achieved. Throughout this specification the term "thermoelectric generator" shall mean thermocouple or thermopile.

Utilizing the reverse effect by introducing electricity into the thermoelectric generator, rather than having the thermoelectric generator generate electricity, and having the hot junction in ambient air and the cold junction in a contained zone to be cooled, the thermoelectric effect can be used to produce a refrigerating device, again of low efficiency, however.

Recent patents have been directed to improvements in the efficiency of the thermopile by increasing the cross-sectional area of the hot junction so that it is larger than the cross-sectional area of the legs or the cold junction, as in U.S. Pat. No. 4,251,290, Gomez, U.S. Pat. No. 4,251,291, Gomez, U.S. Pat. No. 4,257,822, Gomez, and U.S. Pat. No. 4,444,991, Beale. While these patents are concerned with improvements in efficiency through the geometry of the junction cross-sectional area and the legs cross-sectional area, they are not directed to optimizing the effective figure of merit of the system or the effective power output.

SUMMARY OF THE INVENTION

This invention relates to a novel thermoelectric generator in which the effective figure of merit, the effective power coefficient and the power factor may be optimized. This is accomplished by providing a thermoelectric generator formed from thermoelements made from semi-conductor materials supported on pedestals made from materials having good electrical and thermal conductivity. The optimum size and shape of the thermoelectric generator, depending upon the materials used, can also be determined.

It is therefore an object of this invention to increase the power output per amount of thermoelectric element material as compared with the present state of the art.

It is still a further object of this invention to increase the operational efficiency per amount of thermoelectric element material of a thermoelectric generator.

It is still a further object of this invention to provide sufficient spacing between the heat source and the heat sink temperatures in order to maintain large differences in junction temperatures.

It is a still further object of this invention to increase the power output per amount of thermoelectric element material and current density with a decrease in the amount of the thermoelectric semi-conductor material utilized.

It is still a further object of this invention to have a higher efficiency per amount of thermoelectric element material by decreasing the amount of the thermoelectric semi-conductor material by replacing the semi-conductor material with a less expensive support pedestal material.

These, together with other objectives and advantages of the invention, should become apparent in the details of construction and operation, as more fully described herein and claimed.

BRIEF DESCRIPTION OF THE DRAWINGS

For the purpose of illustrating the invention, there is shown in the drawings a form which is presently preferred; it being understood, however, that this invention is not limited to the precise arrangements and instrumentalities shown.

FIG. 6 is a graph showing the relationship of maximum efficiency to the figure of merit for a thermoelectric generator having fixed junction temperatures.

DETAILED DESCRIPTION OF THE INVENTION

Figure 1:
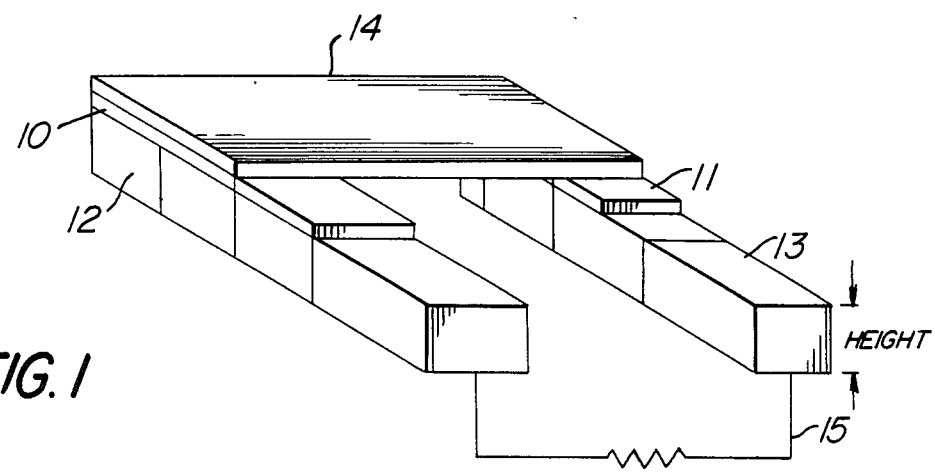
FIG. 1 is a perspective view of the basic thermoelectric generator of this invention.

Referring now more particularly to FIG. 1, the thermoelements are shown at 10 and 11, respectively. They are supported on pedestal supports 12 and 13 and thermoelements 10 and 11 are connected together by means of a bridging conductor 14. The other ends of the support pedestals 12 and 13 may be connected to an electrical load 15.

Figure 2:
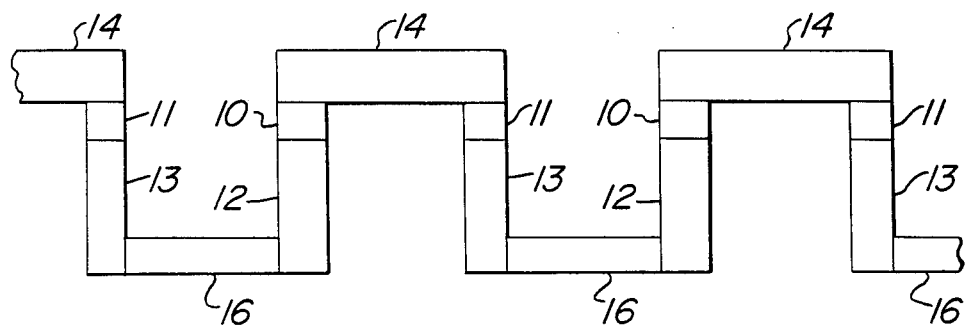
FIG. 2 shows the thermoelectric generator of FIG. 1 connected in series to form a thermopile or thermoelectric generator.

Referring now more particularly to FIG. 2, the basic thermoelectric elements are connected in series with conductors 16—16 connecting pedestal supports 12 and 13.

The efficiency and power output of a thermoelectric generator are dependent upon the material properties of the thermoelements. The basic configuration of a thermoelectric generator consists of two thermoelement-type materials forming a junction in contact with the source of heat, while the other ends of the thermoelements are in thermal contact with the heat sink. The heat sink is at a lower temperature than the heat source. Electric power is delivered to the external resistance 15 ($R_e$) proportional to the temperature difference between the heat source and the heat sink and the intrinsic material properties of the thermocouple. The intrinsic material properties are the Seebeck coefficient ($\alpha$), the thermal conductivity (k) and the electrical conductivity ($\sigma$). Combining the intrinsic material properties, the geometry of the thermal elements making up the thermocouple and subscripting the two branches of the thermocouples to denote the positive and negative conductors (as p and n), each conductor having absolute Seebeck coefficients, respectively, the electrical resistance (R) of the thermal elements is:

$$R = \frac{l_p}{S_p \sigma_p} + \frac{l_n}{S_n \sigma_n}$$

where "l" represents the length of the thermoelement, "S" represents the cross-sectional area of the thermoelement, and "$\sigma$" the electrical conductivity for each thermoelement.

The thermal conductance "K" of the thermoelement is $$K = \frac{S_p k_p}{l_p} + \frac{S_n k_n}{l_n}$$

where "k" is the thermal conductivity. Combining the thermal conductance, electrical resistance, and the Seebeck coefficient, the figure of merit of the basic thermoelement is $$Z = \frac{|\alpha_n| + |\alpha_p|}{RK}$$

The selection of the thermoelectric materials is governed by the figure of merit and the temperature limitations of the materials. Materials with a high "Z" value, which can be operated at high temperature differentials (a high temperature capability at the heat source side) produce more power output. The important consideration in designing a thermoelectric generator is to select a material with a high "Z" value; also being operable at a particular operating source temperature and then optimizing the geometric parameters. Satisfactory materials for thermoelectric elements are semi-conductors such as bismuth telluride, lead telluride, or silicon germanium, depending upon the source temperature involved.

The efficiency of a thermoelectric generator is defined as the ratio of the useful electrical power P delivered to an external load to the thermal power Q absorbed from the heat source, and is given by:

$$Y = P/Q$$

The maximum efficiency of a thermoelectric generator can be defined as the maximum electrical energy delivered to an external circuit divided by the minimum energy consumed from the heat source. The maximum efficiency is:

$$\left[\frac{T_0 - T_1}{T_0}\right] \times \left[\frac{M - 1}{M + \frac{T_1}{T_0}}\right]$$

where $$\frac{T_0 - T_1}{T_0}$$

is the thermodynamic efficiency of a reversible Carnot engine and $$\left[\frac{M - 1}{M + \frac{T_1}{T_0}}\right]$$

is the reduction in the maximum efficiency due to irreversible losses with $$M = \left[1 + \frac{Z(T_1 + T_0)}{2}\right]^{\frac{1}{2}}$$

and
 $T_0$ = Source junction temperature, °K.
 $T_1$ = sink junction temperature, °K.

The maximum efficiency of a thermoelectric generator as a function of the figure of merit for fixed junction temperatures is plotted in graph form in FIG. 6.

The power output from the thermoelements is found by combining the relationships for the temperature differential and the current. The results are $$P = \text{Power output/per thermoelement} = \left[\frac{\alpha_0 \Delta T}{R - R_e}\right]^2 \times R_e$$

where $\alpha_0 = |\alpha_n| + |\alpha_p|$ (Seebeck coefficient)
$\Delta T = T_0 - T_1$
$R_e$ = external resistance This equation indicates the sensitivity of the power output to the Seebeck coefficient, the temperature differential, and the internal resistance. A more general expression for the figure of merit previously set forth is to introduce an effective figure of merit ($Z_{eff}$). The effective figure of merit includes the effects of junction resistance, integrated average material properties, and interelement thermal effects. The resulting expressions for efficiency and power output will then reflect the effective thermal conductance.

$$K_{eff} = K + K_i$$

Where $K_i$ is the thermal conductance of the interelement material and the effective internal resistance is $$R_{eff} = R + R_j$$

where $R_j$ is the combined junction resistances.

In order to increase the effective figure of merit ($Z_{eff}$) as defined by $$Z_{eff} = \frac{|\alpha_n| + |\alpha_p|}{R_{eff} \times K_{eff}}$$

then it is necessary to decrease $R_{eff}$ and/or $K_{eff}$.

In the prior art, the method presently utilized for decreasing $R_{eff}$ and $K_{eff}$ for a given material is to adjust the thermoelectric element geometry which makes the product ($K_{eff}$)($R_{eff}$) minimum for a given total junction resistance and interelement thermal conductance.

This concept results in 1. increases in the amount of the thermoelectric semiconductor material required;
2. cross-sectional area being a function of the thermoelectric semi-conductor element type; and
3. decrease in design flexibility on the heat source or heat sink flux rates.

Figure 12:
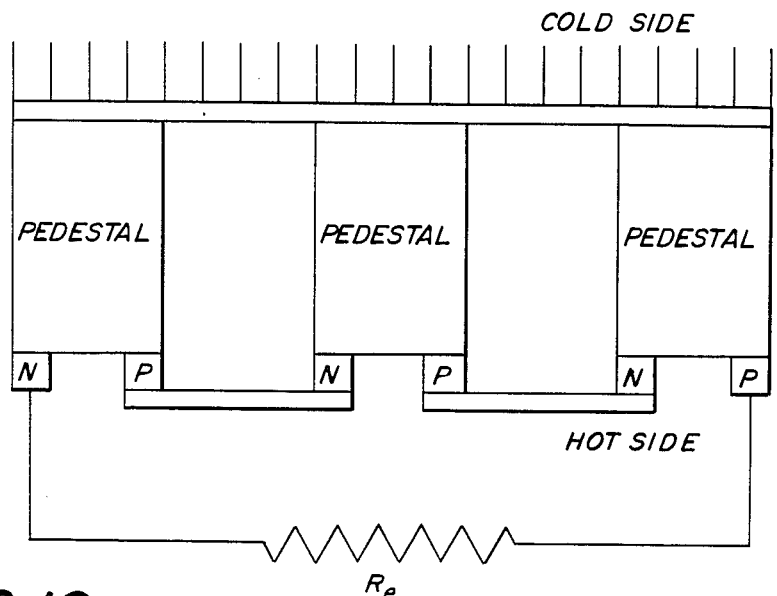
FIG. 12 illustrates a thermoelectric generator having both p and n elements on a single pedestal.
Figure 13:
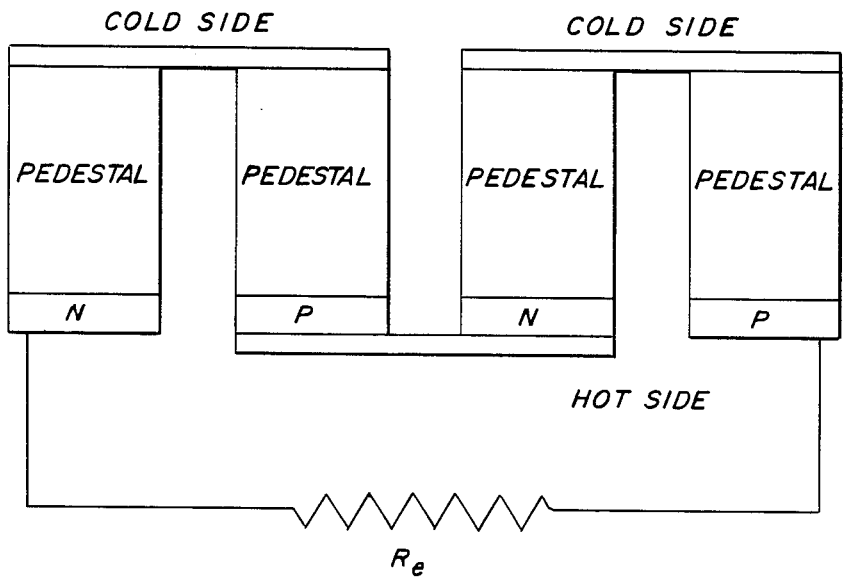
FIG. 13 illustrates a thermoelectric generator having a single p or n element on a pedestal.

In order to avoid these undesirable results, the present invention increases the efficiency in the power output of a thermoelectric generator by introducing support pedestals with different material properties than the basic thermal elements as shown in FIGS. 1, 12 and 13.

Figure 17:
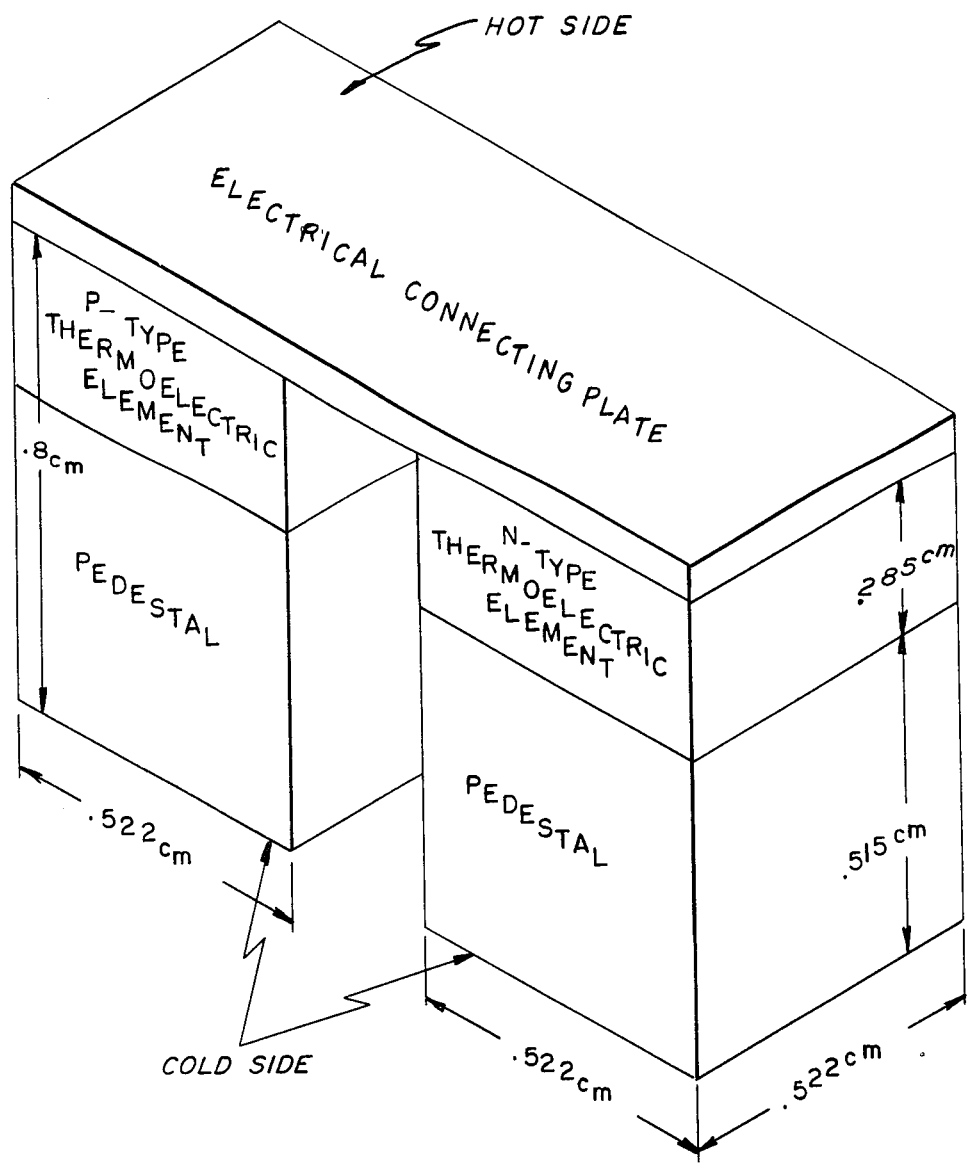
FIG. 17 is a drawing of an exemplary thermoelectric element showing exemplary relative dimensions.

To illustrate, consider the following example (Refer to FIG. 17).

(1) Thermoelectric element 0.522 cm×0.522 cm; resulting cross-section area=0.272 cm²;

(2) Element overall height 0.80 cm (non-pedestal);

(3) Element height 0.285 cm with a pedestal height of 0.515 cm and an overall height 0.80 cm;

(4) Resulting in a normalized height (defined as pedestal height to thermoelectric element height) of 1.807;

(5) The thermoelectric material is Bi₂Te₃ (bismuth telluride) operating with a temperature differential of 353° C. with material properties representative of the temperature gradient.

Table 1 summarizes the resulting operational and material parameters for the pedestal and non-pedestal thermoelectric device.

TABLE 1

OPERATIONAL AND MATERIAL PARAMETERS

| Parameters | With Pedestal | Without Pedestal | Units |
|---|---|---|---|
| Electrical Resistance (R) | .00294 | .00798 | ohms (Ω) |
| Thermal Conductance (K) | .0273 | .0098 | W/°C. |
| Effective Figure of Merit (Z) | $2.00 \times 10^{-3}$ | $2.05 \times 10^{-3}$ | (°C.)$^{-1}$ |
| Element Weight (G) | .614 | 1.722 | grams (g) |
| (Z/G) | $3.25 \times 10^{-3}$ | $1.190 \times 10^{-3}$ | (g °C.)$^{-1}$ |
| Seebeck Coefficient ($\alpha$) | $400 \times 10^{-6}$ | $400 \times 10^{-6}$ | V/°C. |
| Effective Power Coefficient $\left(\frac{\alpha^2}{R}\right)$ | $5.438 \times 10^{-5}$ | $2.006 \times 10^{-5}$ | V²/°C².Ω |
| ($\alpha^2$/RG) | $8.863 \times 10^{-5}$ | $1.164 \times 10^{-5}$ | V²/°C².Ωg |
| Load Circuit Voltage²/(R)* | 6.778 | 2.500 | V²/Ω |
| V²/(RG)* | 11.04 | 1.45 | V²/Ωg |
| Power output (P)* | 1.694 | .6249 | W |
| Efficiency (Y)* | 11.26 | 11.47 | % |
| Y/G* | 18.34 | 6.66 | (g)$^{-1}$ |
| Current (I)* | 23.99 | 8.85 | A |
| Current Density (I/A)* | 88.20 | 32.54 | A/cm² |
| P/G | 2.76 | .363 | W/g |

*At maximum Power Output where the external electrical resistance is equal to the internal electrical resistance.

The series of thermoelectric elements is connected to produce a continuous electrical circuit capable of producing load voltage under a temperature differential across each thermoelectric element. The thermoelectric generator consists of a number of thermoelectric elements in electrical series sufficient to produce the required voltage. See FIG. 1. Each thermoelectric element is positioned upon a thermal and electrical conducting pedestal 12, 13. A number of thermoelectric elements are in electrical series as required to produce a desired load voltage.

The heights of the support pedestals 12 and 13 extending beyond the thermoelements 10 and 11 are adjusted, depending upon the material temperature properties of the thermoelements in order to optimize the effective figure of merit ($Z_{eff}$) or the effective power coefficient ($\Psi_{eff}$), given by $$\Psi_{eff} = \frac{|\alpha_n| + |\alpha_p|^2}{R_{eff}}$$

or the effective power factor, defined as $$\Phi_{eff} = \frac{V^2}{R_{external}}$$

The adjustment of the portion of support pedestals 12 and 13 which extend beyond thermoelements 10 and 11 may be not only in height but can require a different cross-sectional area than the associated thermoelements, as has been shown in FIG. 12.

Figure 3:
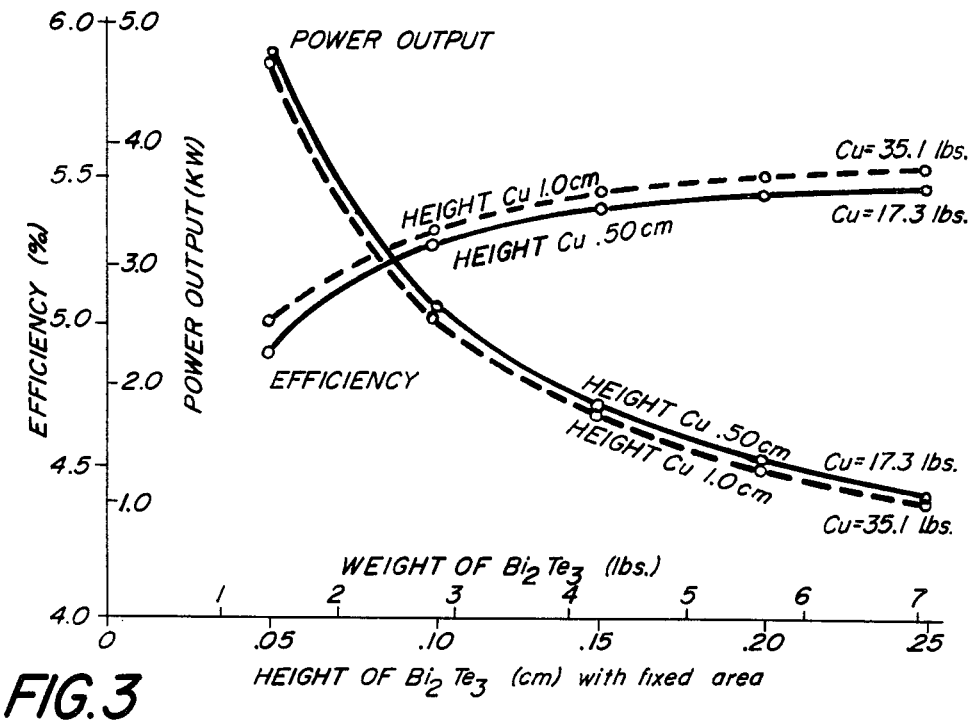
FIG. 3 is a graph showing the effect of a change in height of a copper support pedestal on the power output and efficiency of a thermoelectric generator for a given weight of a particular thermoelement material, specifically bismuth telluride.

Referring now more particularly to FIG. 3, it will be seen that increasing the height of the thermoelements, while maintaining the pedestal height constant, results in a decrease in power output, coupled with an increase in efficiency. However, for a given height of the thermoelements increasing the height of the support pedestal results in an increase in the efficiency with an extremely small decrease in the power output by comparing the dotted curves with the corresponding solid curves. Of course, increasing the height of the thermoelements beyond a predetermined value will marginally increase the efficiency, but at a large increase in overall weight. The cost of increasing the efficiency by increasing the length of the thermoelectric element will increase faster than the rate of efficiency increase. The rate of decreasing power output is directly related to the increase in electrical resistance.

Figure 4:
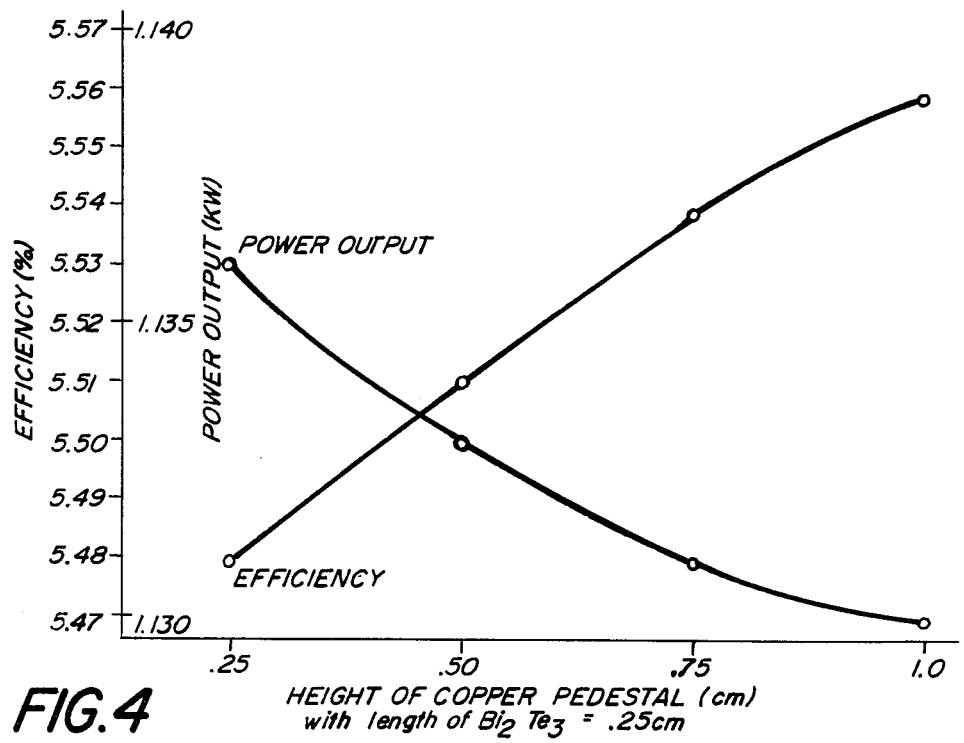
FIG. 4 is a graph showing the effect of an increase in the height of a copper support pedestal with the thermoelements being maintained at a fixed dimension.

Referring now more particularly to FIG. 4, it will be seen that increasing the height of the support pedestal increases the efficiency by decreasing the thermal conductance. The rate of decrease in the power output is relatively small as the electrical resistivity of the support pedestal is small as compared to the thermoelement. The net result is an increase in the effective figure of merit and hence the expected efficiency.

In constructing the thermoelement of FIG. 1, a thin layer of the thermoelement may be deposited on the support pedestals 12 and 13 as by vacuum deposition so as to form the thermoelements 10 and 11, which may be of different lengths and cross-sectional area. The power output/weight of the thermoelement is greatly improved over nonsupport, thermoelectric configurations. Since the cost of the thermoelement material is greater than the support pedestals, the power output/cost would be improved over nonsupport, thermoelectric configurations. Thus it is possible to maximize the use of available energy, increase efficiency, and minimize the mass of thermoelectric material required and maximize the second law efficiency by supporting the required temperature differential between the heat source and the heat sink.

The support pedestals may be constructed of materials such as copper and its alloys or aluminum and its alloys. The support pedestals have relatively high thermal conductivity as compared to the thermoelectric elements, hence the cold side junction temperature of the thermoelement will approach the heat sink temperatures and the change in overall efficiency is extremely small.

Figure 5:
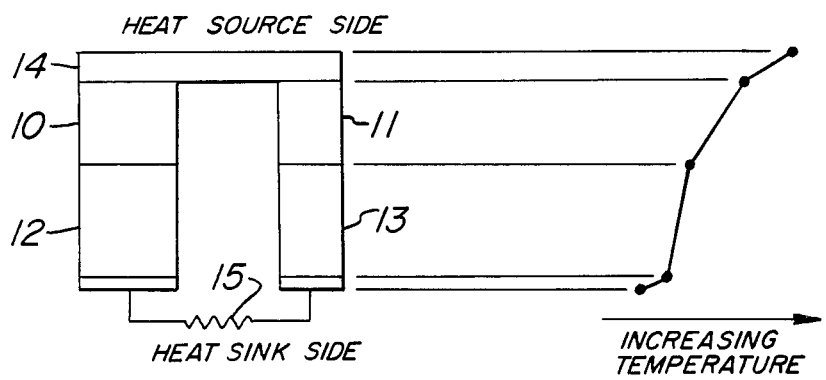
FIG. 5 shows a typical temperature gradient for the thermoelectric generator of this invention.

The pedestal shown in FIG. 2 is positioned in contact with the cold side in order to maximize the thermoelement junction temperature at the hot side. This is illustrated in FIG. 5 where a temperature profile is shown. Since the support pedestals are constructed of material of lower electrical resistance than the thermoelectric elements, thus for the same space between the heat source and the heat sink the thermoelectric generator constructed in accordance with this invention will have the potential for more output of electrical power. The net result is to increase the power coefficient and power factor for a given difference in heat source and heat sink temperatures.

Figure 7:
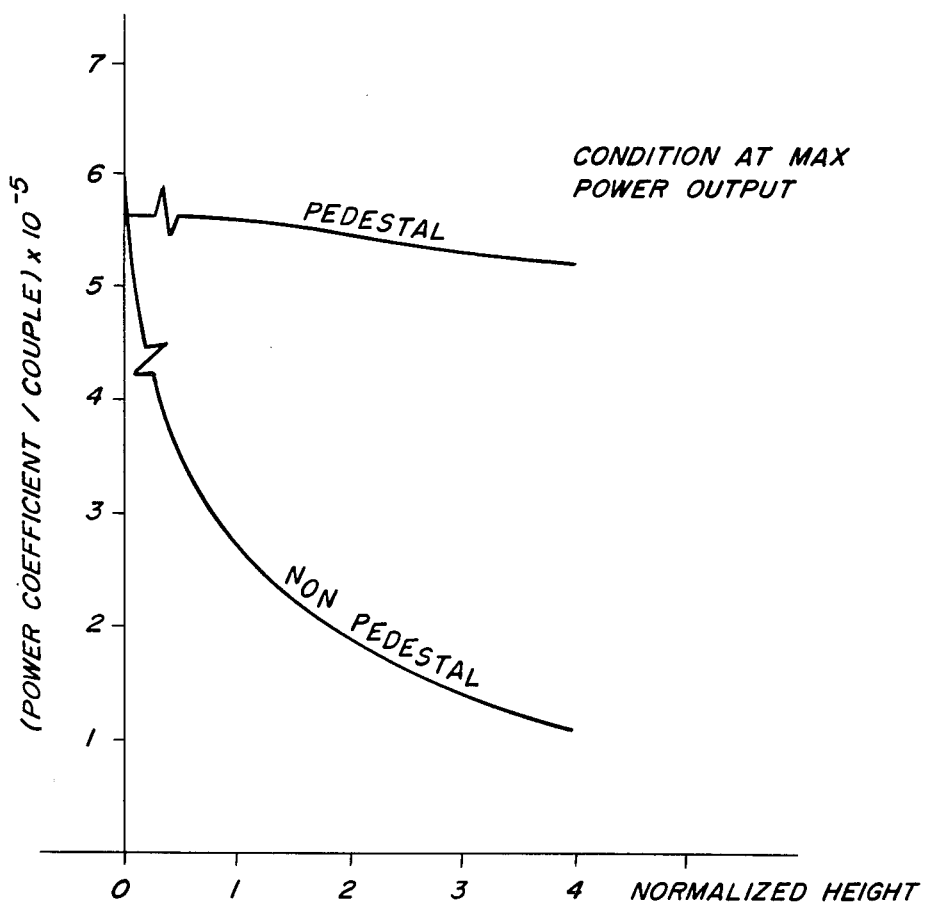
FIG. 7 is a graph showing the power coefficient as a function of the normalized height of both a pedestal and non-pedestal thermoelectric generator.
Figure 8:
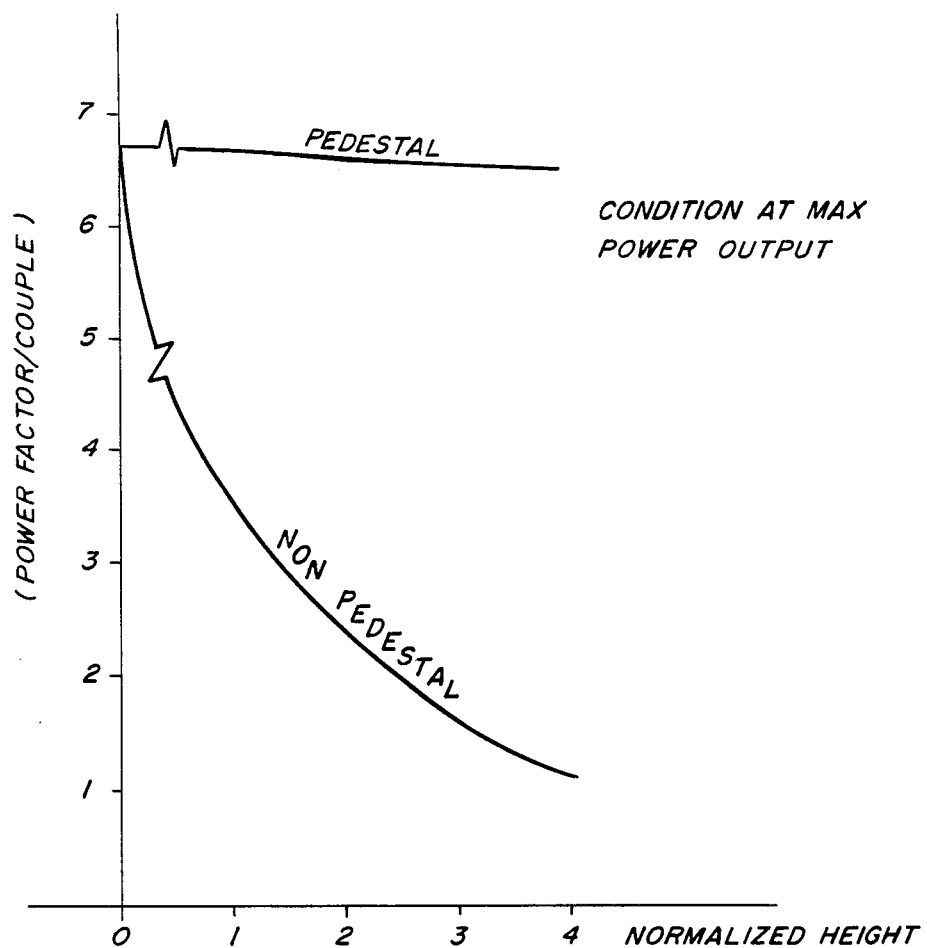
FIG. 8 is a graph of the power factor as a function of the normalized height of both a pedestal and non-pedestal thermoelectric generator.

FIGS. 7 and 8 illustrate the performance for both pedestal and non-pedestal thermoelectric generators as a function of the power coefficient and power factor.

Figure 9:
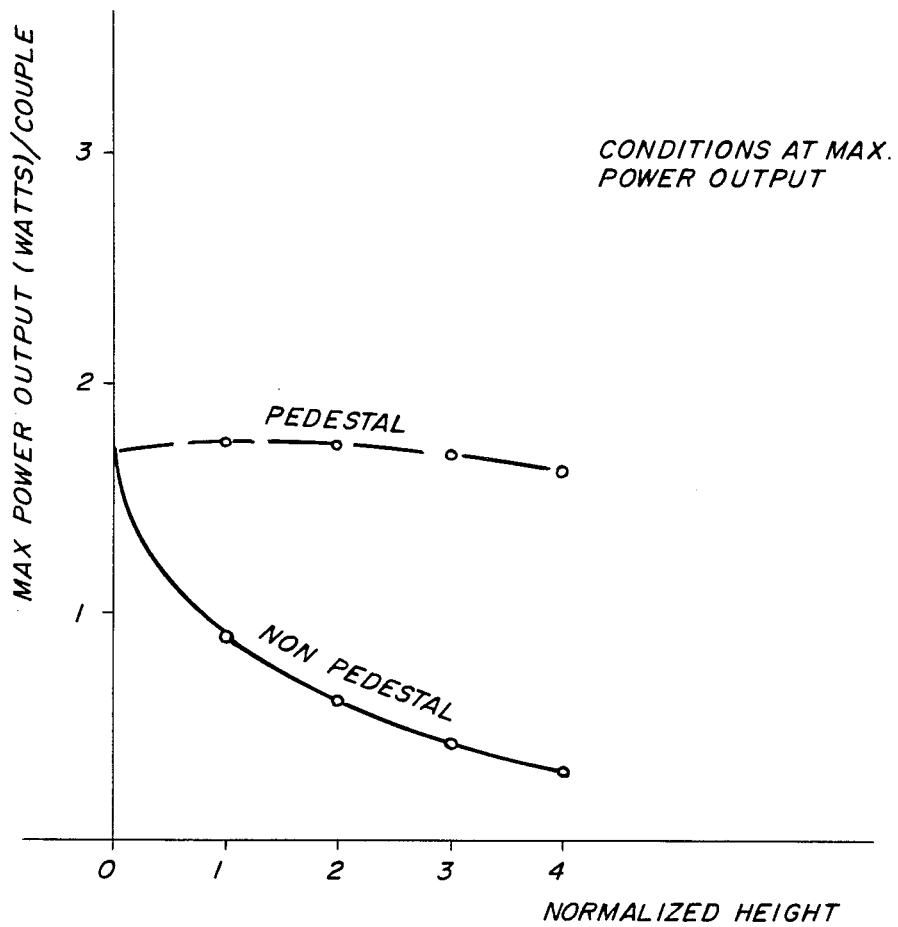
FIG. 9 is a graph of maximum power output of a thermoelectric generator as a function of the normalized height.

FIG. 9 illustrates the maximum power output as a function of the normalized thermoelectric generator height.

Figure 10:
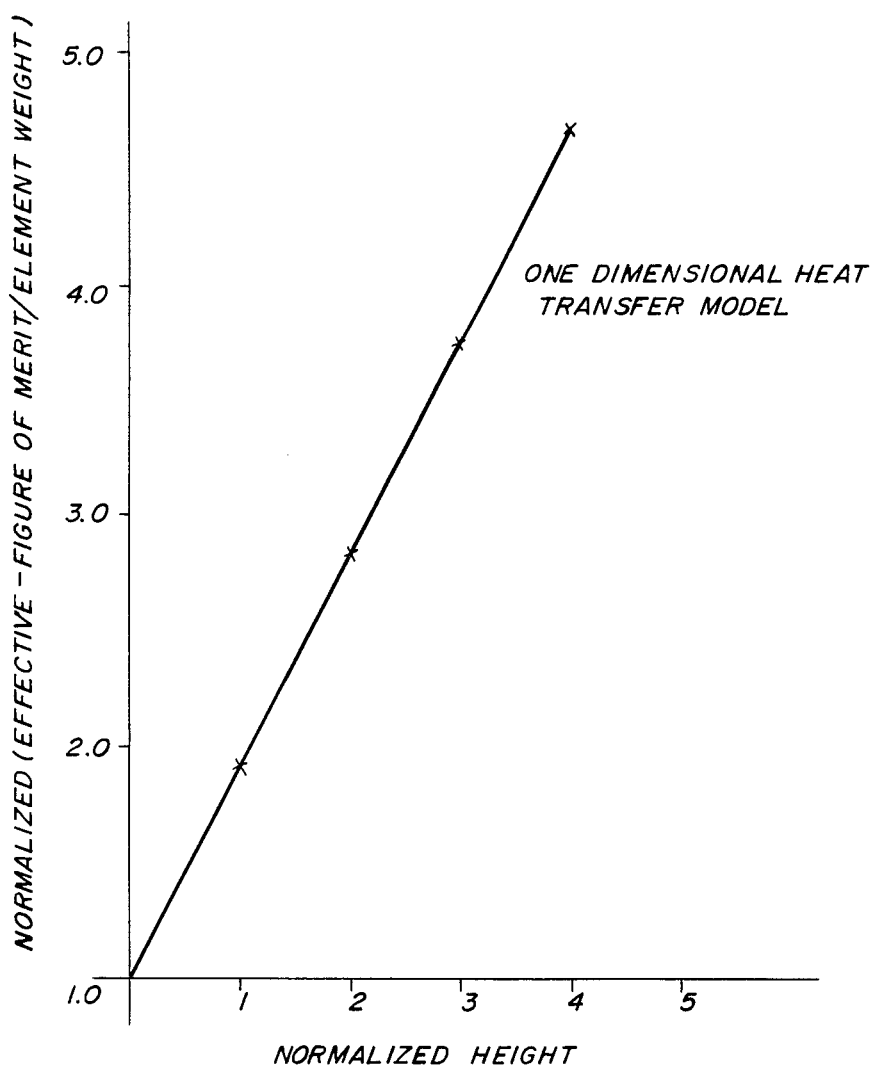
FIG. 10 shows the normalized effective figure of merit as a function or normalized height of the thermoelectric generator.
Figure 11:
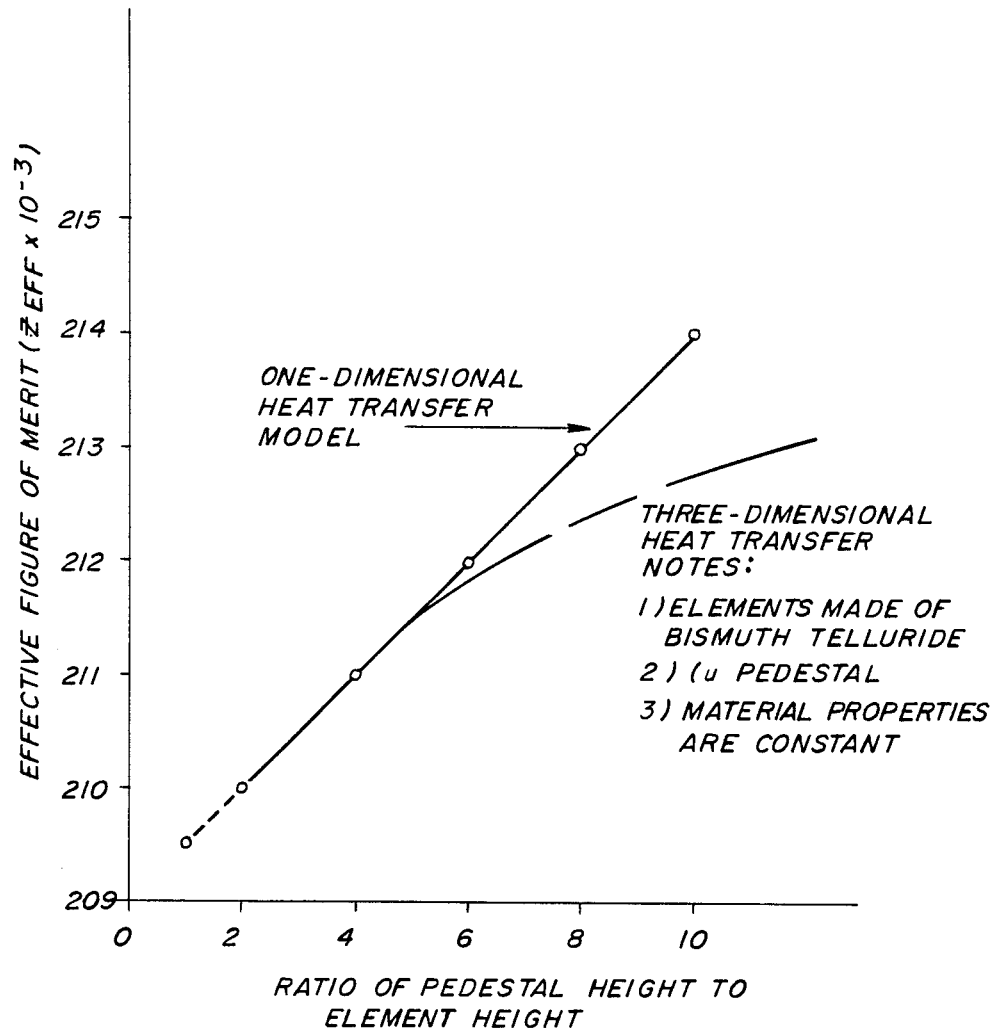
FIG. 11 shows the effective figure of merit as a function of the ratio of pedestal height to element height.

There is a preferred ratio of the pedestal height with a fixed cross-sectional element area to the thermoelectric element height. The ratio ranges from 1 to a maximum of 4. FIG. 10 illustrates the effect of variation in this parameter. Beyond the ratio of 4, the effective figure of merit decreases due to the fact that the product ($R_{EFF} \times K_{EFF}$) increases. FIG. 11 illustrates the relationship of the effective figure of merit to the ratio of support pedestal height to thermoelectric element height. As shown in FIG. 11, the effective figure of merit increases until the ratio of the pedestal height to element height exceeds 4.

Figure 14:
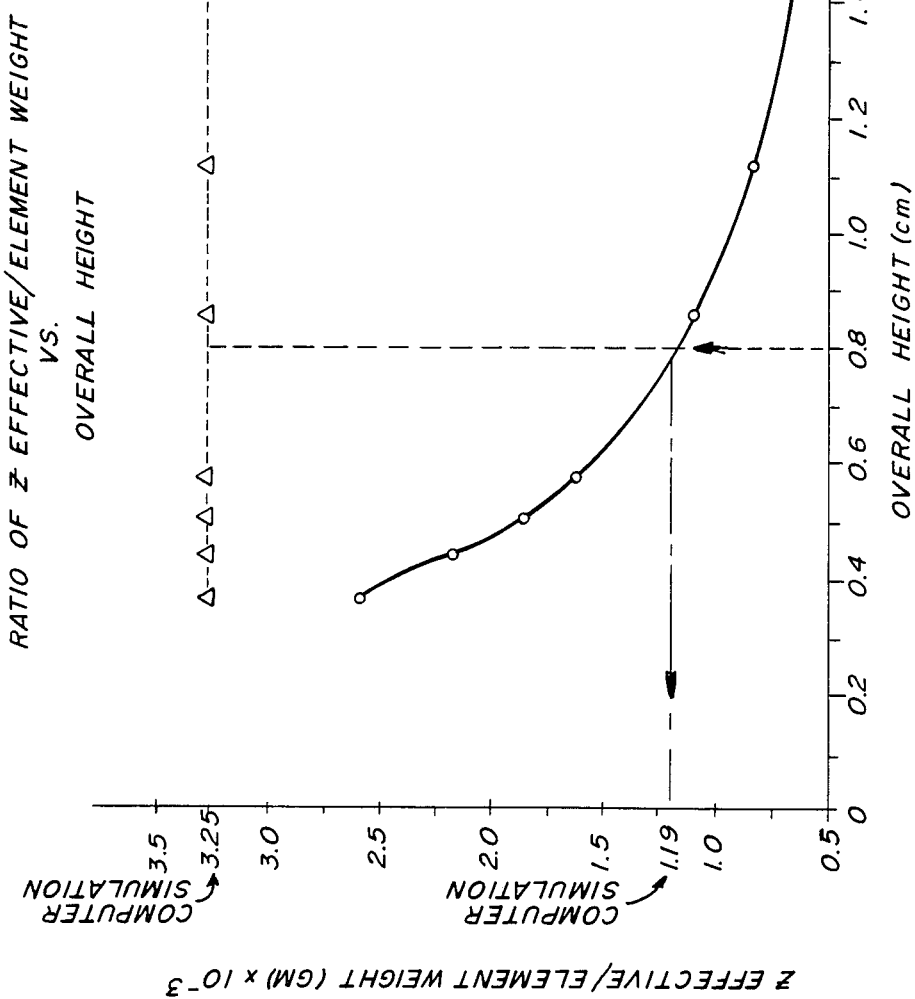
FIG. 14 illustrates the ratio of the effective figure of merit per element weight as a function of overall thermoelectric generator height.
Figure 15:
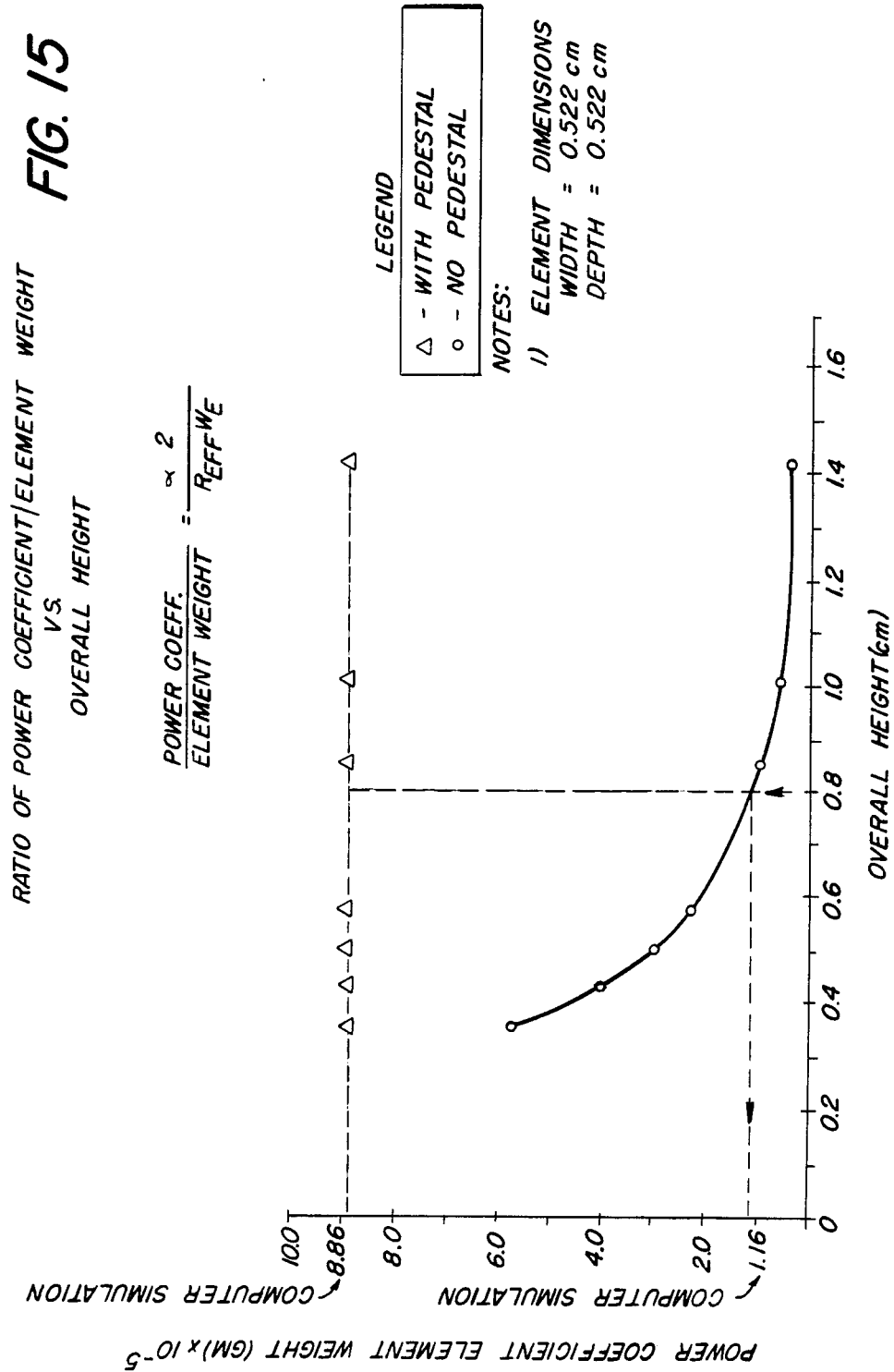
FIG. 15 illustrates the ratio of the power coefficient per element weight as a function of overall thermoelectric generator height.
Figure 16:
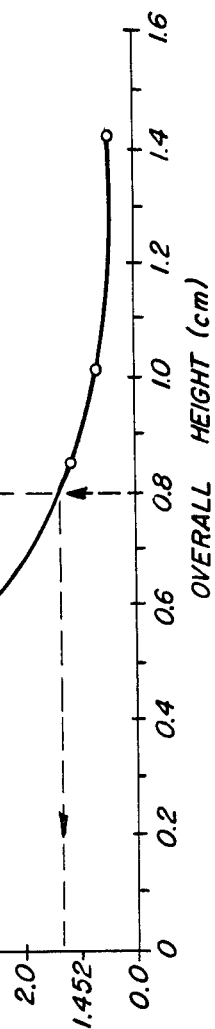
FIG. 16 illustrates the ratio of the power factor per element weight as a function of overall thermoelectric generator height.

FIGS. 14, 15 and 16 illustrate the effective figure of merit, the power coefficient and the power factor normalized by the element height for both pedestal and non-pedestalsupported thermoelements as a function of the overall height.

The present invention may be embodied in other specific forms without departing from the spirit or essential attributes thereof and, accordingly, reference should be made to the appended claims, rather than to the foregoing specification, as indicating the scope of the invention.

I claim:

1. A thermoelectric generator comprising two legs of dissimilar thermoelements connected together at one of each of their respective ends, the other of each of their respective ends being adapted to be connected to an electrical load, each of said thermoelements being supported throughout the majority of its height by a separate support pedestal, each of said support pedestals extending beyond the other end of each of said thermoelement legs, the height of said support pedestals being selected by optimizing the effective figure of merit ($Z_{eff}$) of the thermoelectric generator in accordance with the following equation:

$$Z_{eff} = \frac{|\alpha_n| + |\alpha_p|}{R_{eff} R_{eff}}$$

where $\alpha_n$ is the sum of the Seebeck coefficients of one series of legs of the thermoelectric generator and $\alpha_p$ is the sum of the Seebeck coefficients of the other legs of the thermoelectric generator and $R_{EFF}$ is the effective internal resistance of the system and $K_{EFF}$ is the effective thermal conductance of the thermoelectric generator.

2. A thermoelectric generator comprising a plurality of thermoelectric generators connected in series, each of said thermoelectric generators comprising two legs of dissimilar thermoelements connected together at one of each of their respective ends, the other of their respective ends being adapted to be connected to an electrical load, each of said thermoelements being supported throughout the majority of its height by a support pedestal, each of said support pedestals extending beyond the other end of each of said thermoelement legs and each of said support pedestals being connected to a corresponding support pedestal of the next adjoining thermoelectric generator, the height of the support pedestals being selected by optimizing the effective figure of merit ($Z_{eff}$) of the thermoelectric generator in accordance with the following equation:

$$Z_{eff} = \frac{|\alpha_n| + |\alpha_p|}{R_{eff} R_{eff}}$$

where $\alpha_n$ is the sum of the Seebeck coefficients of one series of legs of the thermoelectric generator and $\alpha_p$ is the sum of the Seebeck coefficients of the other legs of the thermoelectric generator and $R_{EFF}$ is the effective internal resistance of the system and $K_{EFF}$ is the effective thermal conductance of the thermoelectric generator.

3. The thermoelectric generator of claim 2 wherein said thermoelements are selected from the group consisting of bismuth telluride, lead telluride, and silicon germanium.

4. The thermoelectric generator of claim 2 wherein said support pedestals are selected from the group consisting of aluminum and its alloys and copper and its alloys.

5. The thermoelectric generator of claim 2 wherein the heights of said support pedestals are selected by optimizing the effective power coefficient ($\Psi_{eff}$) of the thermoelectric generator in accordance with the following equation:

$$\Psi_{eff} = \frac{|\alpha_n| + |\alpha_p|^2}{R_{eff}}$$

where $\alpha n$ is the sum of the Seebeck coefficients of one series of legs of the thermoelectric generator and $\alpha p$ is the sum of the Seebeck coefficients of the other legs of the thermoelectric generator and $R_{eff}$ is the effective internal resistance of the system.

6. The thermoelectric generator of claim 2 wherein the heights of said support pedestals are selected by optimizing the effective power factor ($\Phi$) of the thermoelectric generator in accordance with the following equation:

$$\Phi = V^2/R_{eff}$$

where V is the output voltage and $R_{eff}$ is the effective internal resistance of the system.

* * * * *